(12) United States Patent
Ohshima (10) Patent No.: US 10,488,715 B2
(45) Date of Patent: Nov. 26, 2019

(54) REFLECTIVE LIQUID CRYSTAL DISPLAY ELEMENT COMPRISING FIRST AND SECOND ALIGNMENT MARKS THAT ARE OPPOSED TO EACH OTHER AND THIRD AND FOURTH ALIGNMENT MARKS DISPOSED AS REFERENCE MARKS

(71) Applicant: JVC KENWOOD Corporation, Yokohama-shi, Kanagawa (JP)

(72) Inventor: Katsunori Ohshima, Yokohama (JP)

(73) Assignee: JVCKENWOOD CORPORATION, Kanagawa (JP)

( * ) Notice: Subject to any disclaimer, the term of this patent is extended or adjusted under 35 U.S.C. 154(b) by 0 days.

(21) Appl. No.: 15/867,999

(22) Filed: Jan. 11, 2018

(65) Prior Publication Data

US 2018/0246362 A1     Aug. 30, 2018

(30) Foreign Application Priority Data

Feb. 28, 2017 (JP) ................................. 2017-036046

(51) Int. Cl.
  *G02F 1/1343*     (2006.01)
  *G03F 9/00*       (2006.01)
  *G02F 1/1333*     (2006.01)

(52) U.S. Cl.
  CPC ........ *G02F 1/134309* (2013.01); *G03F 9/708* (2013.01); *G03F 9/7084* (2013.01); *G02F 2001/133354* (2013.01); *G02F 2203/02* (2013.01)

(58) Field of Classification Search
  CPC ........ G02F 2001/133354; G02F 2001/133519; G02F 2203/02; G02F 2001/13398; G02F 2001/133374; H01L 2223/544; G03F 9/708; G03F 9/7084
  See application file for complete search history.

(56) References Cited

U.S. PATENT DOCUMENTS

| 6,295,107 B1* | 9/2001 | Watanabe ......... G02F 1/133512 349/110 |
| 6,476,890 B1 | 11/2002 | Funahata et al. |
| 2002/0109815 A1* | 8/2002 | Hirakata ............. G02F 1/13392 349/155 |

(Continued)

FOREIGN PATENT DOCUMENTS

JP    2000-131685 A    5/2000

*Primary Examiner* — Paul C Lee
(74) *Attorney, Agent, or Firm* — Procopio, Cory, Hargreaves & Savitch LLP (57) ABSTRACT

According to an embodiment, a reflective liquid crystal display element includes a first substrate, an electronic circuit and an insulating layer including the electronic circuit formed on a surface of the first substrate, a plurality of reflection metal electrodes formed on a surface of the insulating layer, a plurality of spacers, a second substrate opposed to the first substrate with the plurality of spacers interposed therebetween, a plurality of color filters formed on a surface of a second substrate, the plurality of color filters corresponding to the plurality of reflection metal electrodes, a coating layer formed so as to cover the plurality of color filters, a transparent electrode formed on a surface of the coating layer, and a liquid crystal formed in a spatial area between the first and second substrates.

5 Claims, 8 Drawing Sheets

(56) References Cited

U.S. PATENT DOCUMENTS

| | | | | |
|---|---|---|---|---|
| 2004/0218133 A1* | 11/2004 | Park | ............... | G02F 1/133305 349/153 |
| 2010/0271572 A1* | 10/2010 | Yokogawa | ............ | G02F 1/1333 349/96 |
| 2015/0277200 A1* | 10/2015 | Baek | ............... | G02F 1/133512 349/43 |

* cited by examiner

REFLECTIVE LIQUID CRYSTAL DISPLAY ELEMENT COMPRISING FIRST AND SECOND ALIGNMENT MARKS THAT ARE OPPOSED TO EACH OTHER AND THIRD AND FOURTH ALIGNMENT MARKS DISPOSED AS REFERENCE MARKS

CROSS REFERENCE TO RELATED APPLICATION

This application is based upon and claims the benefit of priority from Japanese patent application No. 2017-036046, filed on Feb. 28, 2017, the disclosure of which is incorporated herein in its entirety by reference.

BACKGROUND

The present disclosure relates to a reflective liquid crystal display element and its manufacturing method. For example, the present disclosure relates to a reflective liquid crystal display element having improved quality and its manufacturing method.

There are various types of reflective liquid crystal display elements that display color images. Examples of the types of reflective liquid crystal display devices include a type in which a color image in each pixel is displayed by combining images of three primary colors respectively displayed by three elements, a type in which a color image in each pixel is displayed by switching a color of an image displayed by each element by a field sequential method, and a type in which a color image in each pixel is displayed by a combination of color filters corresponding to three primary colors provided for each element (see Japanese Unexamined Patent Application Publication No. 2000-131685).

Note that in the reflective liquid crystal display element disclosed in Japanese Unexamined Patent Application Publication No. 2000-131685, a substrate on which a reflective film (a reflection metal electrode) and color filters are formed and another substrate on which a transparent electrode is formed are opposed to each other with a liquid crystal interposed therebetween.

SUMMARY

However, the present inventors have found the following problem. In the configuration disclosed in Japanese Unexamined Patent Application Publication No. 2000-131685, since the color filters as well as the liquid crystal are formed between the reflective film and the transparent electrode, the gap (the distance) between the reflective film and the transparent electrode becomes larger. Consequently, in the configuration disclosed in Japanese Unexamined Patent Application Publication No. 2000-131685, it is impossible to drive the liquid crystal with a low voltage. As a result, there is a problem that the consumption power increases. That is, in the configuration disclosed in Japanese Unexamined Patent Application Publication No. 2000-131685, there is a problem that the quality of the reflective liquid crystal display element deteriorates.

A method for manufacturing a reflective liquid crystal display element according to an aspect of an embodiment includes: a step of forming an insulating layer together with an electronic circuit on a surface of a first substrate; a step of forming a plurality of reflection metal electrodes on a surface of the insulating layer; a step of forming a plurality of color filters corresponding to the plurality of reflection metal electrodes on a surface of a second substrate; a step of forming a coating layer so as to cover the plurality of color filters; a step of forming a transparent electrode on a surface of the coating layer; a step of disposing the first and second substrates so that they are opposed to each other with a plurality of spacers interposed therebetween; and a step of injecting a liquid crystal into a spatial area between the first and second substrates.

A reflective liquid crystal display element according to an aspect of an embodiment includes: a first substrate; an electronic circuit and an insulating layer including the electronic circuit formed on a surface of the first substrate; a plurality of reflection metal electrodes formed on a surface of the insulating layer; a plurality of spacers; a second substrate opposed to the first substrate with the plurality of spacers interposed therebetween; a plurality of color filters formed on a surface of a second substrate, the plurality of color filters corresponding to the plurality of reflection metal electrodes; a coating layer formed so as to cover the plurality of color filters; a transparent electrode formed on a surface of the coating layer; and a liquid crystal formed in a spatial area between the first and second substrates.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Embodiments according to the present disclosure are explained hereinafter with reference to the drawings.

Figure 1:
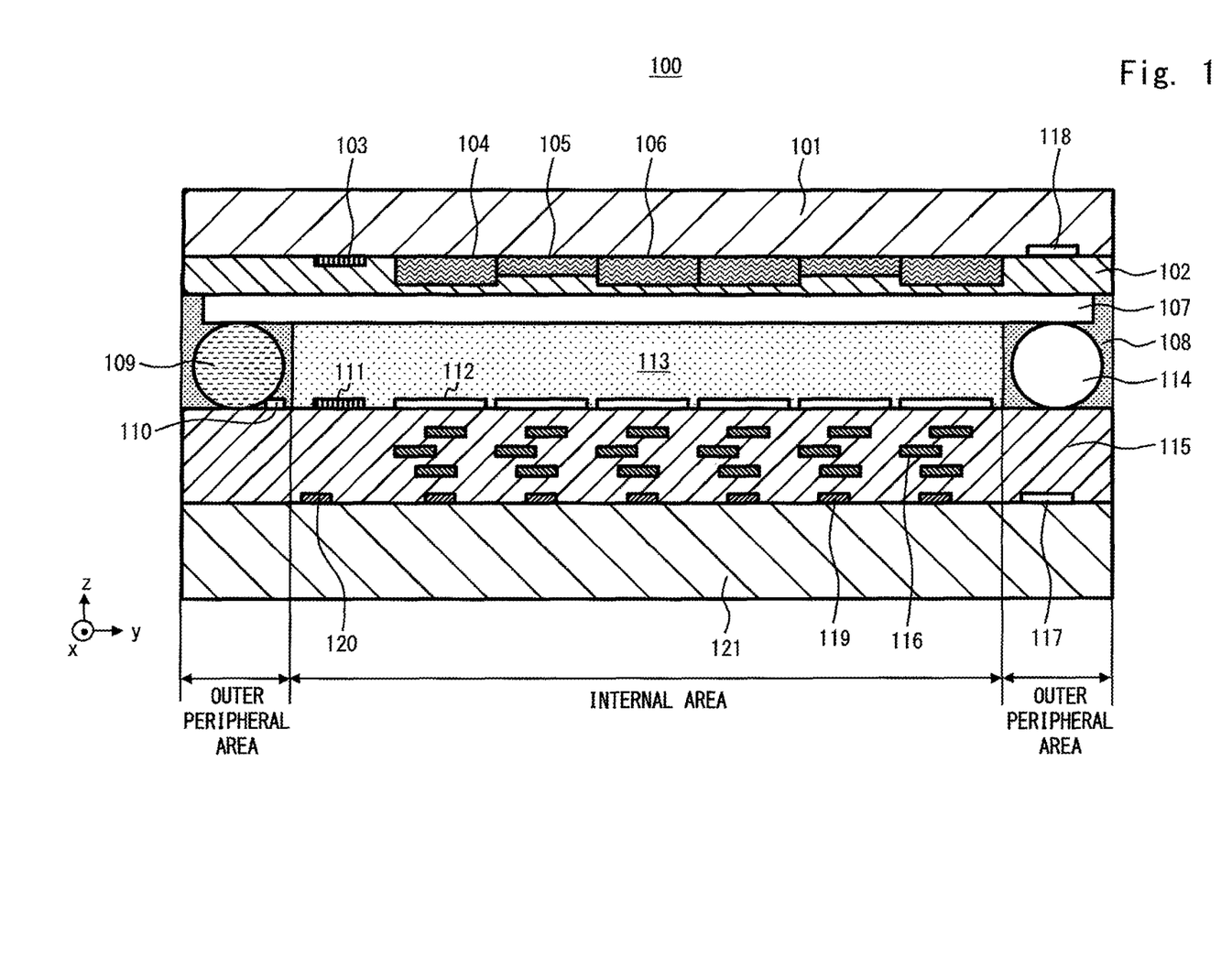
FIG. 1 is a schematic cross section showing a reflective liquid crystal display element according to a first embodiment.

FIG. 1 is a schematic cross section showing a reflective liquid crystal display element 100.

Figure 2:
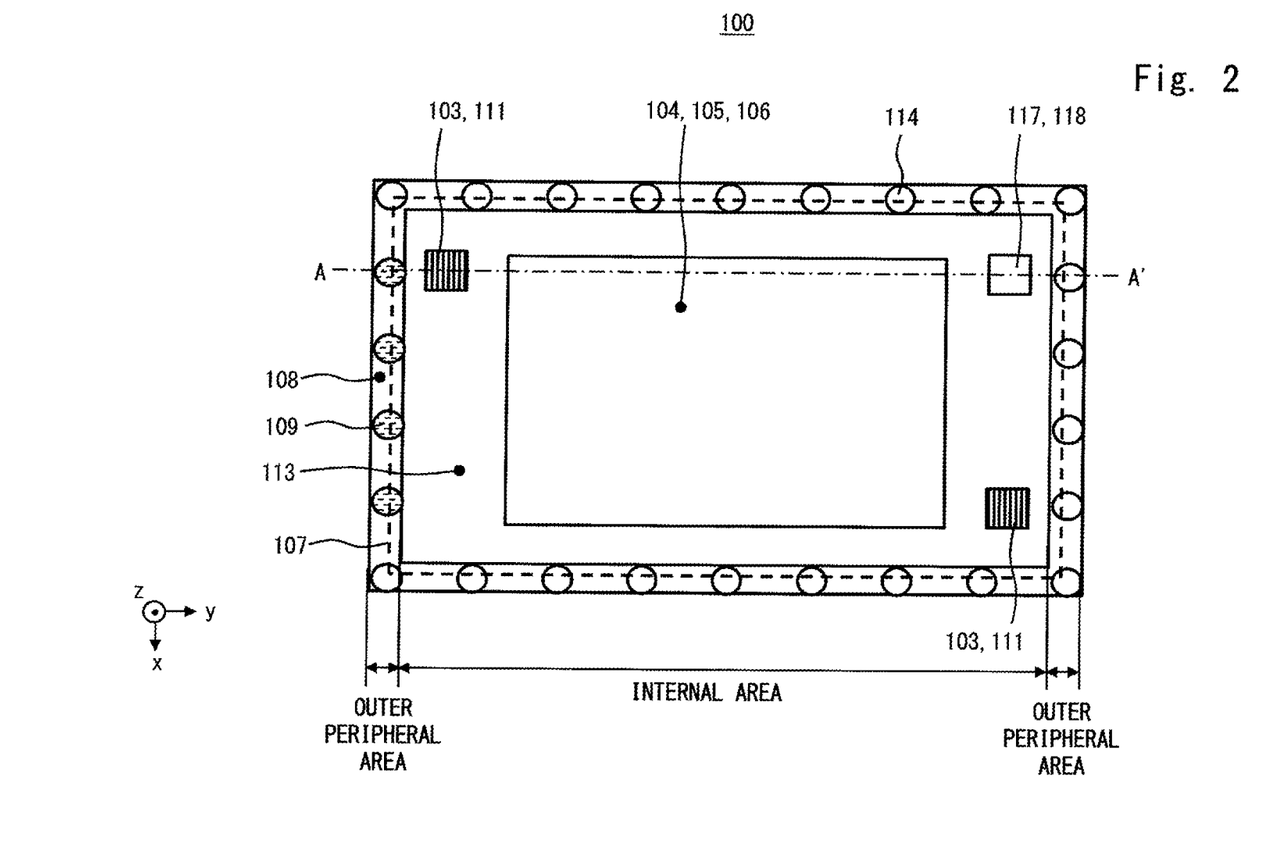
FIG. 2 is a schematic plan view showing the reflective liquid crystal display element according to the first embodiment.

FIG. 2 is a schematic plan view showing the reflective liquid crystal display element 100.

As shown in FIG. 1, the reflective liquid crystal display element 100 includes a glass substrate (second substrate) 101, a coating layer 102, a bonding alignment mark (second alignment mark) 103, green, red and blue filters 104, 105 and 106, a transparent electrode 107, a sealing material 108, a conductive spacer 109, an electrode 110, a bonding alignment mark (first alignment mark) 111, reflection metal electrodes 112, a liquid crystal 113, a non-conductive spacer 114, an insulating layer 115, metal lines 116, alignment marks 117 and 118, transistors 119 and 120, and a silicon substrate (first substrate) 121. Note that an alignment film is provided in each of both surfaces of the liquid crystal 113 and a polarizing plate is provided on the glass substrate 101, though they are not illustrated in the drawing.

An electronic circuit composed of the plurality of transistors 119 and 120, and the metal lines 116, the insulating layer 115 including the electronic circuit, and the alignment mark 117 are formed on the silicon substrate 121. Note that places on the silicon substrate 121 where respective components are formed are determined by using the place where the alignment mark 117 is formed as a reference place. Although a case in which the silicon substrate 121 is provided is explained in this embodiment, a glass substrate may be used in place of the silicon substrate 121.

Further, on the insulating layer 115, the plurality of reflection metal electrodes 112 and the bonding alignment mark 111 are formed in an internal area of the chip (i.e., an area where the liquid crystal 113 is formed). Further, the electrode 110 is formed in an outer peripheral area of the chip (i.e., an area where the sealing material 108 is formed). Referring to FIG. 2, two bonding alignment marks 111 are formed on a diagonal line of the chip having a rectangular shape in a plan view.

Further, on the insulating layer 115, the sealing material 108 is formed in the outer peripheral area of the chip. Referring to FIG. 2, the sealing material 108 is formed along the outer periphery of the chip having the rectangular shape in a plan view. A plurality of spherical spacers are formed inside the sealing material 108. In this way, a uniform space is secured between the glass substrate 101 and the silicon substrate 121. Some of the plurality of spacers are conductive spacers 109 and the other spacers are non-conductive spacers 114. It should be noted the conductive spacers 109 are disposed so that they are in contact with the electrode 110.

The glass substrate 101 is opposed to the silicon substrate 121 with the plurality of spacers interposed therebetween. The alignment mark 118 is formed on the glass substrate 101. Note that places on the glass substrate 101 where respective components are formed are determined by using the place where the alignment mark 118 is formed as a reference place.

Further, on the glass substrate 101, the plurality of color filters 104 to 106 corresponding to the plurality of reflection metal electrodes 112 and the bonding alignment mark 103 are formed in the internal area of the chip (i.e., the area where the liquid crystal 113 is formed). Referring to FIG. 2, two bonding alignment marks 103 are formed on a diagonal line of the chip having the rectangular shape in a plan view so that they are opposed to the bonding alignment marks 111.

Further, the coating layer 102 is formed so as to cover the plurality of color filters 104 to 106. The coating layer 102 flattens a surface of the glass substrate 101. Further, the transparent electrode 107 is formed on a surface of the coating layer 102.

The liquid crystal 113 is sealed (i.e., hermetically contained) in a spatial area surrounded by the silicon substrate 121, the glass substrate 101, and the sealing material 108.

Note that the conductive spacers 109 are in contact with an end of the transparent electrode 107 as well as being in contact with the electrode 110. In this way, for example, electric power that is output when the transistor 120 is turned on is supplied to the transparent electrode 107 through the electrode 110 and the conductive spacers 109 and, as a result, the liquid crystal 113 is driven.

In the reflective liquid crystal display element 100, external light is reflected on the reflection metal electrodes 112 and passes through the liquid crystal 113. Then, after being colored by the color filters 104 to 106, the colored light is displayed on a monitor as an image.

(Method for Manufacturing Reflective Liquid Crystal Display Element)

Figure 3:
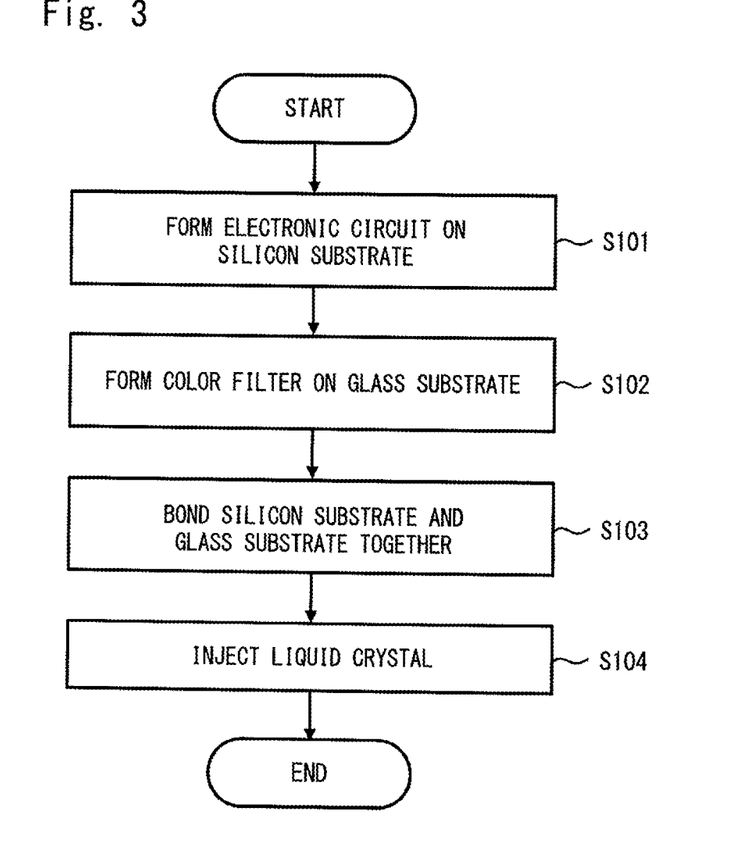
FIG. 3 is a flowchart showing a method for manufacturing the reflective liquid crystal display element shown in FIG. 1.

Next, a method for manufacturing a reflective liquid crystal display element according to this embodiment is explained with reference to FIGS. 3 to 7. FIG. 3 is a flowchart showing a method for manufacturing a reflective liquid crystal display element according to the first embodiment. FIGS. 4 to 7 are schematic cross sections for explaining respective steps of the manufacturing process for the reflective liquid crystal display element according to the first embodiment.

Firstly, an electronic circuit for driving a liquid crystal is formed on a silicon substrate 121 (step S101 in FIG. 3). The formation of the electronic circuit is explained hereinafter in a concrete manner with reference to FIG. 4.

Figure 4:
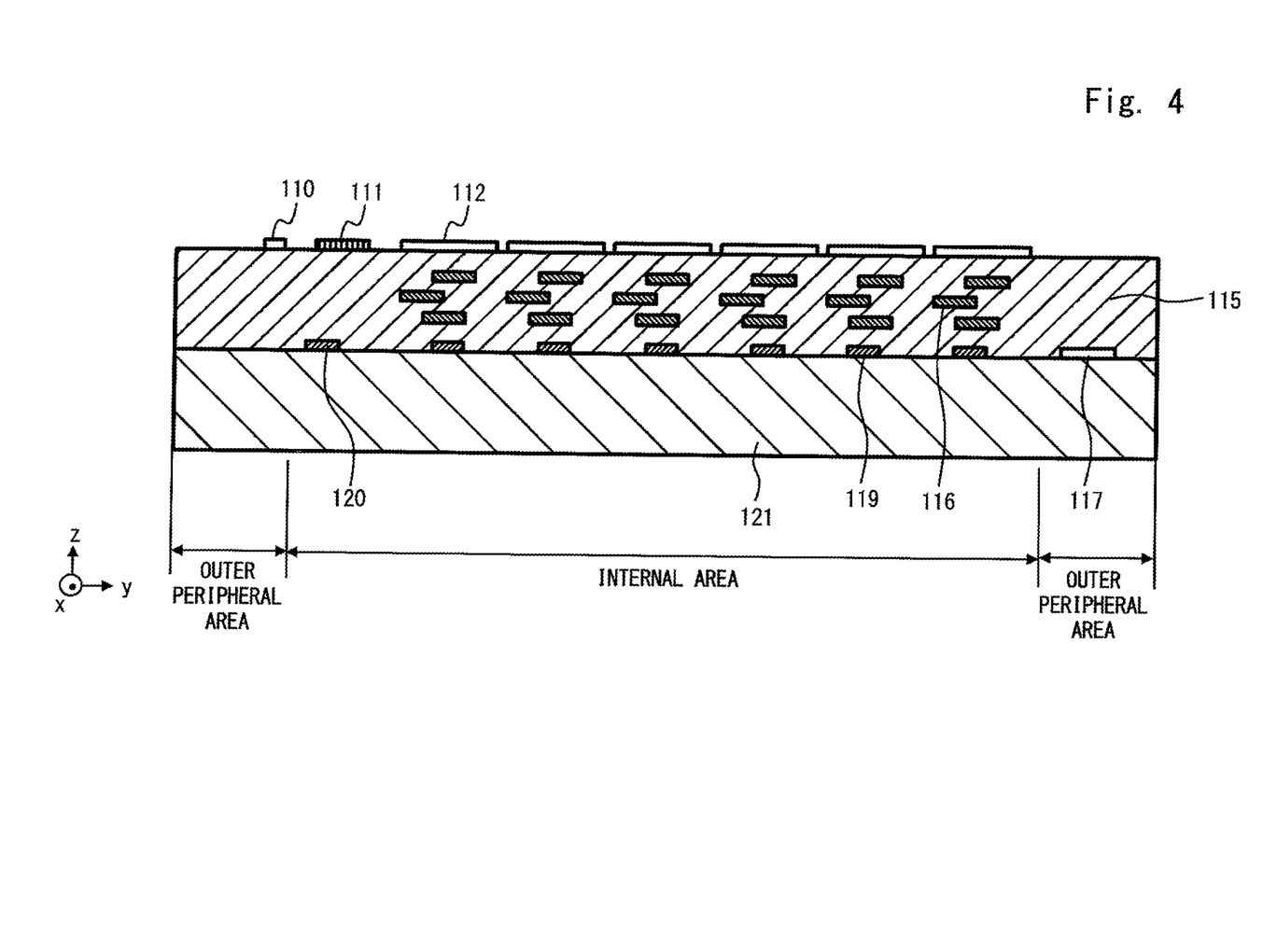
FIG. 4 is a schematic cross section for explaining a manufacturing process for the reflective liquid crystal display element shown in FIG. 1.

As shown in FIG. 4, firstly, an alignment mark 117 is formed on a surface of the silicon substrate 121. After that, various components are formed on the silicon substrate 121 by using the alignment mark 117 as a reference point.

After the formation of the alignment mark 117, a plurality of transistors 119 and a transistor 120 are formed in the same layer that the alignment mark 117 is formed in. Note that the plurality of transistors 119 are transistors for performing switching as to whether electric power is supplied to the reflection metal electrodes 112 or not. Further, the transistor 120 is a transistor for performing switching as to whether electric power is supplied to the electrode 110 or not.

After that, a plurality of metal lines 116 are formed in a plurality of wiring layers located above the layer in which the transistors are formed in such a manner that an insulating layer 115 is interposed between the wiring layers. After that, in an uppermost layer (located on a surface of the insulating layer 115), an electrode 110 is formed in an outer peripheral area of the chip (i.e., an area where the sealing material 108 is formed) and a plurality of reflection metal electrodes 112 and a bonding alignment mark 111 are formed in an internal area of the chip (i.e., an area where the liquid crystal 113 is formed). In this way, an electronic circuit is formed on the silicon substrate 121.

Note that the bonding alignment mark 111 is used to align the silicon substrate 121 with the glass substrate 101 when they are bonded together. Referring to FIG. 2, in the reflective liquid crystal display element 100, for one chip, two bonding alignment marks 111 are arranged on a diagonal line of the chip.

Next, color filters are formed on the glass substrate 101 (step S102 in FIG. 3). The formation of the filters is explained hereinafter in a concrete manner with reference to FIG. 5.

Figure 5:
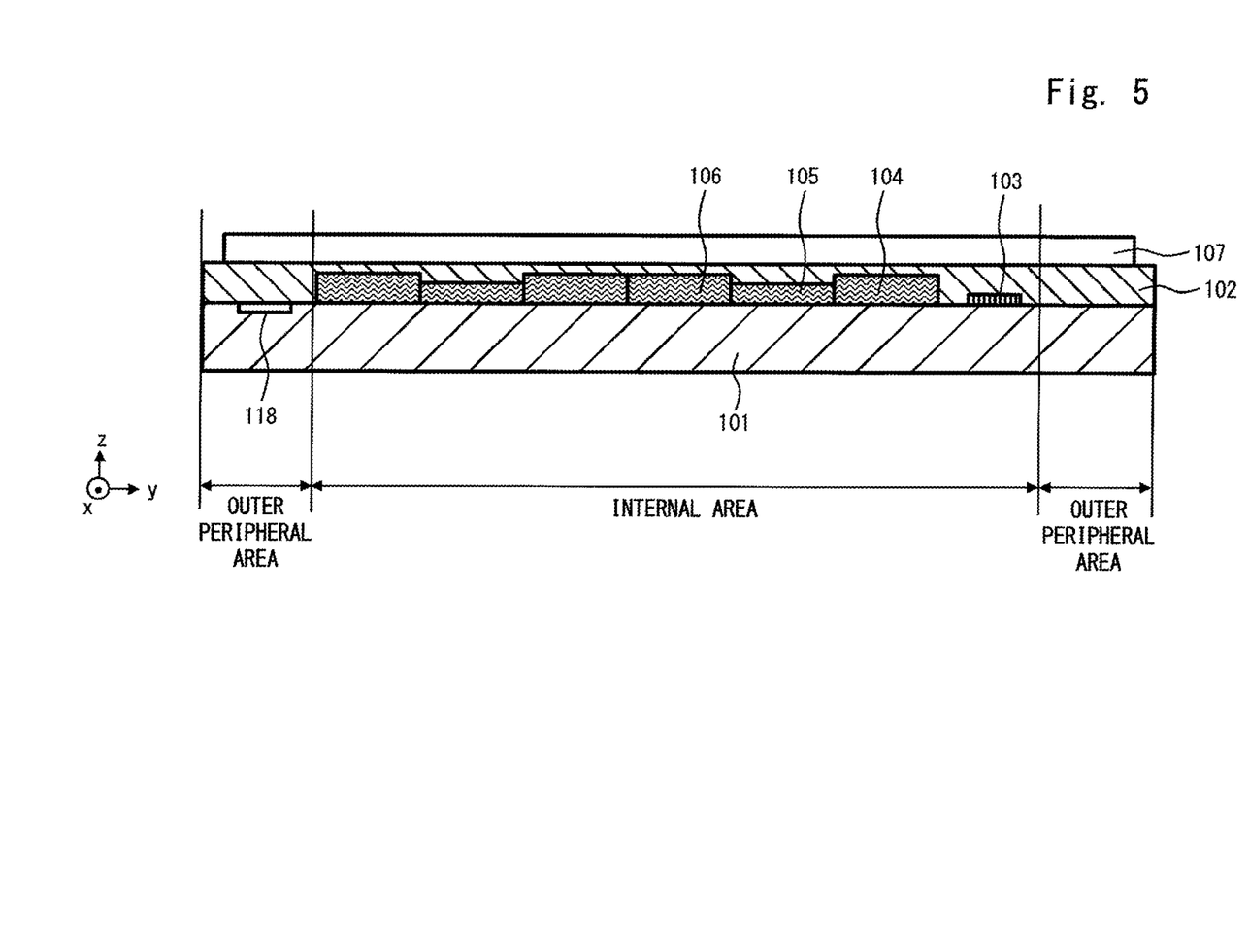
FIG. 5 is a schematic cross section for explaining a manufacturing process for the reflective liquid crystal display element shown in FIG. 1.

As shown in FIG. 5, firstly, an alignment mark 118 is formed on a surface of the glass substrate 101. After that, various components are formed on the glass substrate 101 by using the alignment mark 118 as a reference point.

After the formation of the alignment mark 118, color filters 104 to 106 for three colors, i.e., for green, red and blue, respectively, are formed one by one on a surface of the glass substrate 101. Further, a bonding alignment mark 103 is also formed.

Note that the bonding alignment mark 103 is used to align the silicon substrate 121 with the glass substrate 101 when they are bonded together. Referring to FIG. 2, in the reflective liquid crystal display element 100, for one chip, two bonding alignment marks 103 are arranged on a diagonal line of the chip.

After that, a coating layer 102 is formed over the entire surface of the glass substrate 101 so as to cover the color filters 104 to 106 and the bonding alignment mark 103. As a result, the surface of the glass substrate 101 is flattened.

After that, a transparent electrode 107 is formed on a surface of the coating layer 102. More specifically, after the transparent electrode 107 is formed on the entire surface of the coating layer 102, an outer peripheral end part of the transparent electrode 107 is removed by etching. As a result, the transparent electrode 107 is formed into a rectangular shape one size smaller than the chip in a plan view (see FIG. 2). In other words, the transparent electrode 107 is formed in such a manner that it projects from the internal area of the chip into a part of the outer peripheral area thereof.

Next, the silicon substrate 121 and the glass substrate 101 are bonded together (step S103 in FIG. 3). The bonding of the substrates is explained hereinafter in a concrete manner with reference to FIG. 6.

Figure 6:
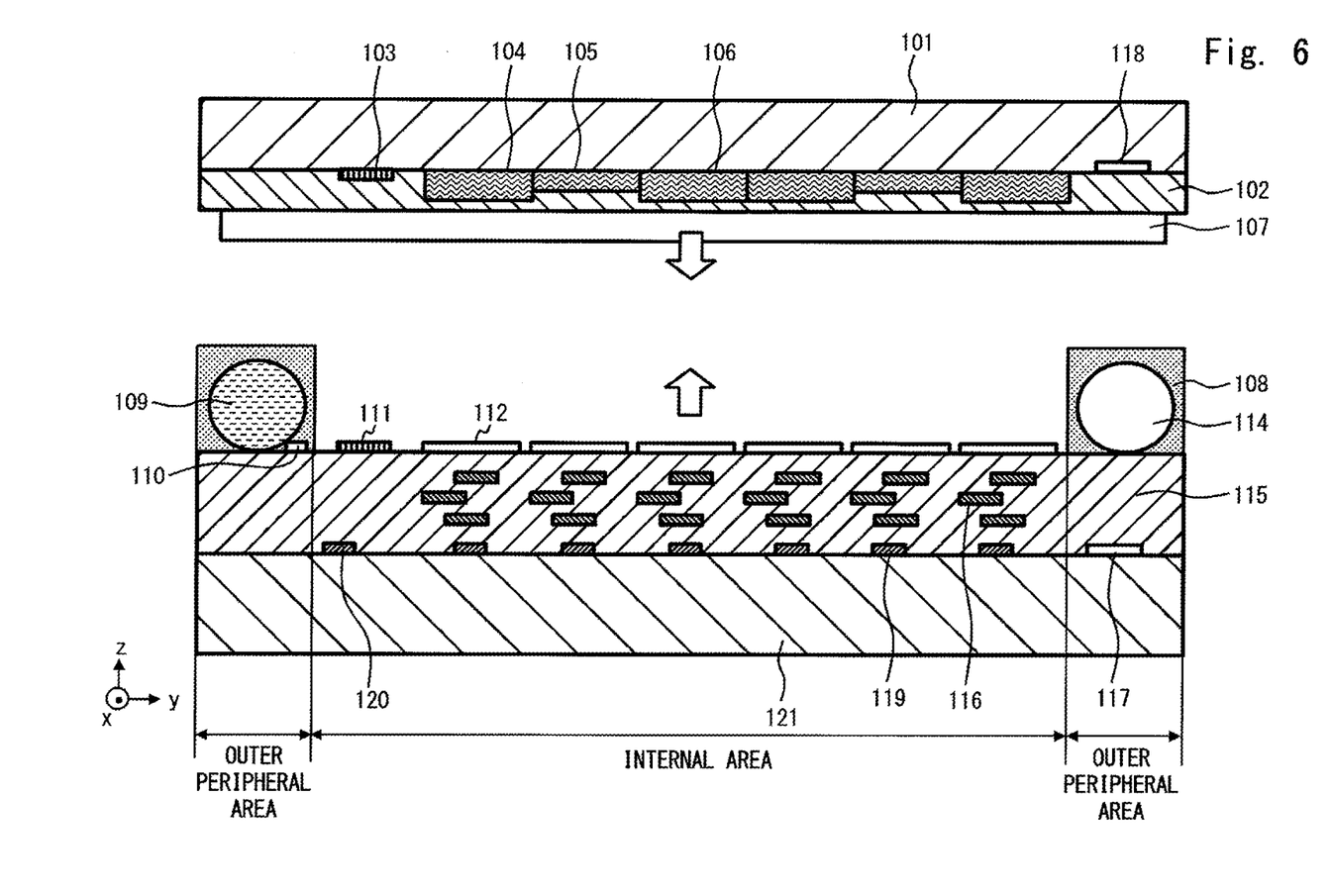
FIG. 6 is a schematic cross section for explaining a manufacturing process for the reflective liquid crystal display element shown in FIG. 1.

As shown in FIG. 6, firstly, a sealing material 108 is disposed along an outer periphery of the chip on a surface of the silicon substrate 121 (more specifically, a surface of the insulating layer 115 formed on the silicon substrate 121). A plurality of spherical spacers are disposed inside the sealing material 108. Some of the plurality of spacers are conductive spacers 109 and the other spacers are non-conductive spacers 114. It should be noted that the conductive spacers 109 are disposed so that they are in contact with the electrode 110.

After that, the silicon substrate 121 and the glass substrate 101 are bonded together in such a manner that the bonding alignment marks 111 and 103 are opposed to each other. In other words, the silicon substrate 121 and the glass substrate 101 are bonded together so that the positions of the bonding alignment marks 111 and 103 coincide with each other in a plan view.

It should be noted that the bonding alignment mark 111 is formed in an uppermost layer of the silicon substrate 121 (more specifically, it is formed on a surface of the insulating layer 115 formed on the silicon substrate 121). In this way, it is possible to adjust the positional relation between the silicon substrate 121 and the glass substrate 101 in a state where the bonding alignment marks 111 and 103 are located close to each other and thereby to accurately arrange the silicon substrate 121 and the glass substrate 101 so that they are opposed to each other.

After that, the sealing material 108 is cured by irradiating it with UV (ultraviolet) rays in a state where the silicon substrate 121 and the glass substrate 101 are bonded together. As a result, the silicon substrate 121 and the glass substrate 101 are joined together. Note that in this state, the conductive spacers 109 are in contact with an end of the transparent electrode 107 as well as being in contact with the electrode 110. In this way, electric power that is output when the transistor 120 is turned on is supplied to the transparent electrode 107 through the electrode 110 and the conductive spacers 109.

Figure 7:
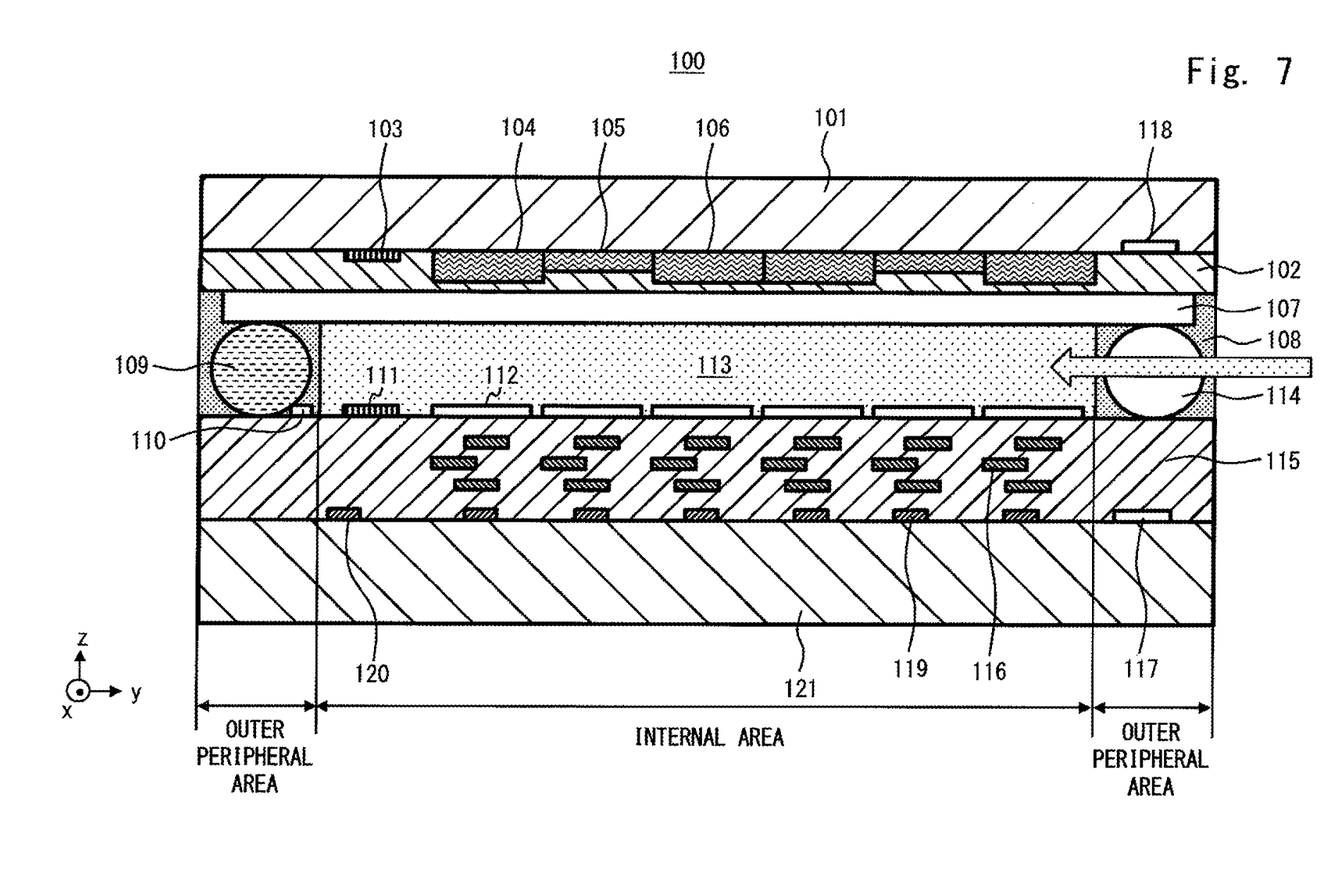
FIG. 7 is a schematic cross section for explaining a manufacturing process for the reflective liquid crystal display element shown in FIG. 1.

Next, a liquid crystal 113 is injected (step S104 in FIG. 3). Specifically, as shown in FIG. 7, the liquid crystal 113 is injected into a spatial area surrounded by the silicon substrate 121, the glass substrate 101, and the sealing material 108 in a vacuum state.

Through the above-described processes, a reflective liquid crystal display element 100 according to this embodiment as shown in FIG. 2 and FIG. 1 is manufactured.

As described above, the reflective liquid crystal display element 100 and its manufacturing method according to this embodiment make it possible to reduce a gap (a distance) between the transparent electrode 107 and the reflection metal electrodes 112 compared to the gap in the reflective liquid crystal display element in which color filters are formed in a layer located above the reflection metal electrodes 112. As a result, since the reflective liquid crystal display element 100 and its manufacturing method according to this embodiment make it possible to drive the liquid crystal 113 with a low voltage and hence to prevent an increase in the power consumption. That is, the reflective liquid crystal display element 100 and its manufacturing method according to this embodiment can improve the quality of the element.

Further, in the reflective liquid crystal display element 100 and its manufacturing method according to this embodiment, the plurality of spacers are disposed inside the sealing material 108, which is disposed along the outer periphery of the chip, and hence are disposed in a place different from the place where the bonding alignment marks 103 and 111 are disposed in a plan view. Therefore, in the reflective liquid crystal display element 100 and its manufacturing method according to this embodiment, it is possible to adjust the positional relation between the silicon substrate 121 and the glass substrate 101 by using the bonding alignment marks 111 and 103 without obstructing the field of view due to the presence of the plurality of spacers.

Further, in the reflective liquid crystal display element 100 and its manufacturing method according to this embodiment, the end of the transparent electrode 107 is not confined within the internal area of the chip (i.e., the area where the liquid crystal 113 is formed) but extends into the outer peripheral area of the chip (i.e., the area where the sealing material 108 is formed). Therefore, the liquid crystal 113 is not affected by the electric field that is concentrated at the end of the transparent electrode 107.

Further, in the reflective liquid crystal display element 100 and its manufacturing method according to this embodiment, electric power that is output when the transistor 120 is turned on is supplied to the transparent electrode 107 through the electrode 110 and the conductive spacers 109 disposed in the chip. Therefore, no power supply path such as a wiring line is formed outside the chip. Consequently, in the reflective liquid crystal display element 100 and its manufacturing method according to this embodiment, it is possible to prevent a failure caused by a broken wire or the like.

Further, in the reflective liquid crystal display element 100 and its manufacturing method according to this embodiment, the bonding alignment mark 111 as well as the reflection metal electrodes 112 are formed in the uppermost layer of the silicon substrate 121 (more specifically, on the surface of the insulating layer 115 formed on the silicon substrate 121). As a result, in the reflective liquid crystal display element 100 and its manufacturing method according to this embodiment, it is possible to adjust the positional relation between the silicon substrate 121 and the glass substrate 101 in a state where the bonding alignment marks 111 and 103 are located close to each other and thereby to accurately arrange the silicon substrate 121 and the glass substrate 101 so that they are opposed to each other.

Further, in the reflective liquid crystal display element 100 and its manufacturing method according to this embodiment, on the silicon substrate 121, two bonding alignment marks 111 are arranged on a diagonal line of the chip in a plan view. Further, on the glass substrate 101, two bonding alignment marks 103 are arranged on the diagonal line of the chip in a plan view. Therefore, it is also possible to prevent or reduce a positional deviation in a rotational direction between the silicon substrate 121 and the glass substrate 101 when they are opposed to each other.

Second Embodiment

FIGS. 8A to 8D are schematic cross sections for explaining a part of a manufacturing process for a reflective liquid crystal display element according to a second embodiment. FIGS. 8A to 8D show a method for accurately arranging the silicon substrate 121 and the glass substrate 101 of the reflective liquid crystal display element 100 so that they are opposed each other. The method is explained hereafter in a concrete manner.

Figure 8A:
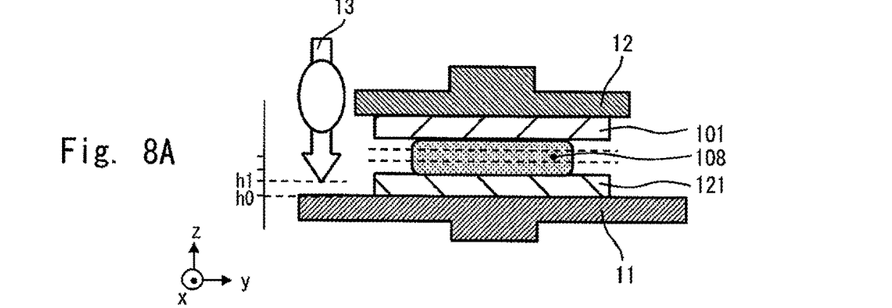
FIG. 8A is a schematic cross section for explaining a manufacturing process for a reflective liquid crystal display element according to a second embodiment.

Firstly, as shown in FIG. 8A, a silicon substrate 121 on which an electronic circuit, reflection metal electrodes 112, a bonding alignment mark 111, and so on are formed is placed on a stage 11 of a manufacturing apparatus 1 for a reflective liquid crystal display element. Further, a sealing material 108 is disposed on the silicon substrate 121 (more specifically, in an outer peripheral area on the silicon substrate 121). Further, a glass substrate 101 on which color filters 104 to 106, a transparent electrode 107, a bonding alignment mark 103, and so on are formed is disposed on the sealing material 108.

Note that the silicon substrate 121 and the glass substrate 101 are disposed so that the bonding alignment marks 111 and 103 are opposed to each other. In other words, the silicon substrate 121 and the glass substrate 101 are disposed so that a deviation between the bonding alignment marks 111 and 103 is within a range of permissible values (e.g., within a range of permissible values in the order of several micrometers) in a plan view.

After that, a fixing member 12 of the manufacturing apparatus 1 is placed above the glass substrate 101. In this way, the silicon substrate 121, the sealing material 108, and the glass substrate 101 are sandwiched by the stage 11 and the fixing member 12. Note that in this state, a height of the stage 11 is h0 and a height of a tip of a stopper 13 is set to h1 (h1>h0).

For example, a thickness of the sealing material 108 is 20 µm to several tens of micrometers before it is compressed and its thickness decreases to several micrometers after the compression is completed.

Figure 8B:
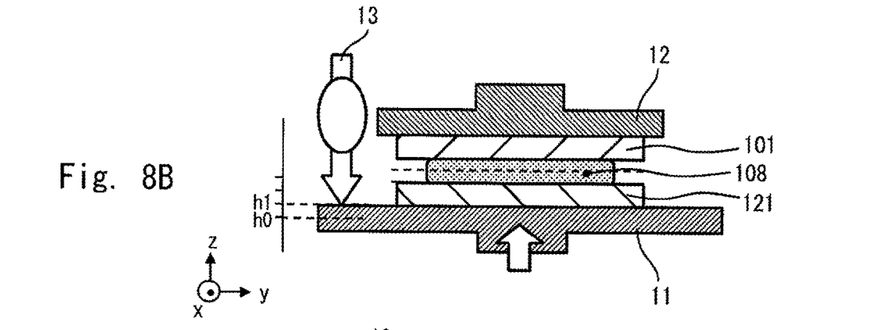
FIG. 8B is a schematic cross section for explaining a manufacturing process for a reflective liquid crystal display element according to a second embodiment.

After that, as shown in FIG. 8B, the stage 11 is moved vertically upward (i.e., in a positive direction along a z-axis) from the height h0 to the height h1, which is the height of the stopper 13. As a result, the silicon substrate 121 and the glass substrate 101 are compressed in a direction in which they are brought into close contact with each other.

In this process, during the movement of the stage 11 from the height h0 to the height h1 (i.e., during the compression process), when a deviation between the positions of the bonding alignment marks 111 and 103 in a plan view is not larger than a permissible value (a predetermined value), the compression is continued. On the other hand, when the deviation between the positions of the bonding alignment marks 111 and 103 in a plan view has exceeded the permissible value, the compression is stopped. Then, while maintaining the stage 11 at the height at the time just before the compression is stopped, one of the positions of the silicon substrate 121 and the glass substrate 101 is adjusted so that the positional deviation becomes equal to or smaller than the permissible value. After that, the compression is restarted and the stage 11 is moved to the height h1.

Figure 8C:
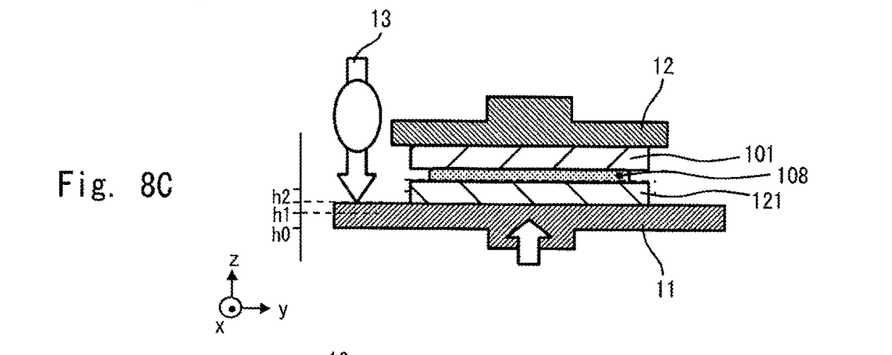
FIG. 8C is a schematic cross section for explaining a manufacturing process for a reflective liquid crystal display element according to a second embodiment.

After that, as shown in FIG. 8C, the height of the stopper 13 is set to a height h2 (h2>h1) and then the stage 11 is moved vertically upward (i.e., in the positive direction along the z-axis) from the height h1 to the height h2.

In this process, during the movement of the stage 11 from the height h1 to the height h2 (i.e., during the compression process), when the deviation between the positions of the bonding alignment marks 111 and 103 in a plan view is not larger than the permissible value, the compression is continued. On the other hand, when the deviation between the positions of the bonding alignment marks 111 and 103 in a plan view has exceeded the permissible value, the compression is stopped. Then, while maintaining the stage 11 at the height at the time just before the compression is stopped, one of the positions of the silicon substrate 121 and the glass substrate 101 is adjusted so that the positional deviation becomes equal to or smaller than the permissible value. After that, the compression is restarted and the stage 11 is moved to the height h2.

Figure 8D:
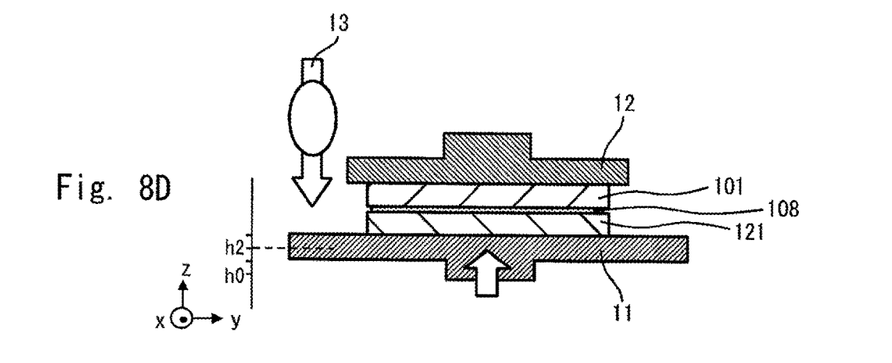
FIG. 8D is a schematic cross section for explaining a manufacturing process for a reflective liquid crystal display element according to a second embodiment.

After that, as shown in FIG. 8D, the stopper 13 is released and then the stage 11 is moved vertically upward (i.e., in the positive direction along the z-axis) from the height h2 until the gap between the silicon substrate 121 and the glass substrate 101 becomes a desired value.

In this process, during the upward movement of the stage 11 from the height h2 (i.e., during the compression process), when the deviation between the positions of the bonding alignment marks 111 and 103 in a plan view is not larger than the permissible value, the compression is continued. On the other hand, when the deviation between the positions of the bonding alignment marks 111 and 103 in a plan view has exceeded the permissible value, the compression is stopped. Then, one of the positions of the silicon substrate 121 and the glass substrate 101 is adjusted so that the positional deviation becomes equal to or smaller than the permissible value. After that, the compression is restarted and the stage 11 is moved until the gap between the silicon substrate 121 and the glass substrate 101 becomes the desired value. After that, a final adjustment for reducing the positional deviation is performed and the sealing material 108 is cured.

As described above, in the manufacturing method for a reflective liquid crystal display element according to this embodiment, during the compression process for the silicon substrate and the glass substrate, it is determined whether or not the deviation between the position of the alignment mark formed in the silicon substrate and the position of the alignment mark formed in the glass substrate is within a permissible range. Then, when the deviation is not within the permissible range, the compression is stopped. Further, after the position is adjusted so that the deviation falls within the permissible range, the compression is restarted. In this way, in the manufacturing method for a reflective liquid crystal display element according to this embodiment, it is possible to accurately arrange the silicon substrate and the glass substrate so that they are opposed to each other. That is, in the manufacturing method for a reflective liquid crystal display element according to this embodiment, it is possible to improve the quality of the reflective liquid crystal display element.

Note that in the case of a manufacturing method for a reflective liquid crystal display element in which an adjustment for reducing a positional deviation is performed only before and after the compression, there is a possibility that the positional deviation could become very large after the completion is completed. In such a case, there is a possibility that, for example, the reflection metal electrodes on the silicon substrate and/or the transparent electrode on the glass substrate could be damaged by the plurality of spherical spacers disposed inside the sealing material because the adjustment for reducing the positional deviation needs to be performed in a state where a high pressure is applied. Further, there is a possibility that the sealing material could expand into an unintended area. Further, there is a possibility that the gap between the silicon substrate and the glass substrate could become nonuniform.

In contrast to this, in the case of the manufacturing method for a reflective liquid crystal display element according to this embodiment, before the compression is completed (more preferably, during the compression process), it is determined whether or not the deviation between the position of the alignment mark formed in the silicon substrate and the position of the alignment mark formed in the glass substrate is within a permissible range. Then, if necessary, the position is adjusted for reducing the deviation. In this way, it is possible to adjust the position for reducing the deviation in a state where a pressure that is smaller than the finally-applied pressure is applied. Further, it is possible to reduce the necessary adjustment for reducing the deviation as much as possible. Therefore, for example, it is possible to prevent the reflection metal electrodes on the silicon substrate and the transparent electrode on the glass substrate from being damaged by the plurality of spherical spacers disposed inside the sealing material. Further, it is possible to prevent the sealing material from expanding into an unintended area. Further, it is possible to make the gap between the silicon substrate and the glass substrate uniform.

Although an example case in which the compression is performed in three divided stages is explained in this embodiment, the present disclosure is not limited to this example. That is, the compression process may be divided into an arbitrary number of stages. Further, an example case in which it is determined whether or not the positional deviation is within a permissible range during the compression process is explained in this embodiment, the present disclosure is not limited to this example. That is, it may be determined whether or not the positional deviation is within a permissible range after the completion of each stage of the compression.

As described above, the reflective liquid crystal display element and its manufacturing method according to the above-described first embodiment make it possible to reduce a gap (a distance) between the transparent electrode 107 and the reflection metal electrodes 112 compared to the gap in the reflective liquid crystal display element in which color filters are formed in a layer located above the reflection metal electrodes 112. As a result, since the reflective liquid crystal display element and its manufacturing method according to the above-described first embodiment make it possible to drive the liquid crystal 113 with a low voltage and hence to prevent an increase in the power consumption. In addition to the above-described other advantageous effects, the reflective liquid crystal display element and its manufacturing method according to the above-described first embodiment can improve the quality of the reflective liquid crystal display element.

Further, in the manufacturing method for a reflective liquid crystal display element according to the above-described second embodiment, during the compression process for the silicon substrate and the glass substrate, it is determined whether or not the deviation between the position of the alignment mark formed in the silicon substrate and the position of the alignment mark formed in the glass substrate is within a permissible range. Then, when the deviation is not within the permissible range, the compression is stopped. Further, after the position is adjusted so that the deviation falls within the permissible range, the compression is restarted. In this way, in the manufacturing method for a reflective liquid crystal display element according to the above-described second embodiment, it is possible to accurately arrange the silicon substrate and the glass substrate so that they are opposed to each other. That is, in the manufacturing method for a reflective liquid crystal display element according to the above-described second embodiment, it is possible to improve the quality of the reflective liquid crystal display element.

Note that the present disclosure is not limited to the above-described embodiments, and various modifications can be made without departing from the spirit of the present disclosure.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A reflective liquid crystal display element comprising:
   a first substrate;
   an electronic circuit and an insulating layer including the electronic circuit formed on a surface of the first substrate;
   a plurality of reflection metal electrodes formed on a surface of the insulating layer;
   a plurality of spacers;
   a second substrate opposed to the first substrate with the plurality of spacers interposed therebetween;
   a liquid crystal formed in a spatial area between the second substrate and the plurality of reflection metal electrodes;
   a plurality of color filters formed between the second substrate and the liquid crystal, the plurality of color filters corresponding to the plurality of reflection metal electrodes;
   a coating layer formed so as to cover the plurality of color filters;
   a transparent electrode formed on a surface of the coating layer;
   a first alignment mark formed together with the plurality of reflection metal electrodes on the surface of the insulating layer;
   a second alignment mark formed together with the plurality of color filters on the surface of the second substrate;

a third alignment mark formed on the surface of the first substrate in a different layer than the first alignment mark, the third alignment mark to be a reference when the plurality of reflection metal electrodes and the first alignment mark are formed; and a fourth alignment mark formed on the surface of the second substrate to be a reference when the plurality of color filters and the second alignment mark are formed, wherein the first and second substrates are disposed so that the first and second alignment marks are opposed to each other, and both the third and fourth alignment marks are disposed at places different from places where the first and second alignment marks are disposed.

2. The reflective liquid crystal display element according to claim 1,
wherein
the first alignment mark is formed of two marks,
the second alignment mark is formed of two marks, and
the first and second substrates are disposed so that the two marks of the first alignment mark are opposed to the two marks of the second alignment mark, respectively.

3. The reflective liquid crystal display element according to claim 1, wherein at least one of the plurality of spacers is a conductive spacer configured to electrically connect the electronic circuit with the transparent electrode, the reflective liquid crystal display element further comprises an electrode configured to supply electric power to the conductive spacer, and the electrode is formed by using the third alignment mark as a reference point.

4. The reflective liquid crystal display element according to claim 1, wherein the transparent electrode is formed so as to extend into an area where the liquid crystal is not formed.

5. The reflective liquid crystal display element according to claim 1, further comprising a sealing material configured to seal the liquid crystal together with the first and second substrates between the first and second substrates, wherein the plurality of spacers are disposed inside the sealing material.

* * * * *